US007259774B2

(12) United States Patent
Beier

(10) Patent No.: US 7,259,774 B2
(45) Date of Patent: Aug. 21, 2007

(54) METHOD AND DEVICE FOR IMAGING OF A PRINTING FORM

(75) Inventor: Bernard Beier, Ladenburg (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 217 days.

(21) Appl. No.: 11/006,301

(22) Filed: Dec. 6, 2004

(65) Prior Publication Data

US 2005/0134676 A1 Jun. 23, 2005

(30) Foreign Application Priority Data

Dec. 9, 2003 (DE) ................................ 103 57 432

(51) Int. Cl.
*G03F 7/20* (2006.01)
*B41J 2/435* (2006.01)

(52) U.S. Cl. ....................................... 347/132; 347/247

(58) Field of Classification Search ................ 347/129, 347/130, 132, 237, 247
See application file for complete search history.

(56) References Cited

U.S. PATENT DOCUMENTS

| | | | |
|---|---|---|---|
| 5,485,480 A | 1/1996 | Kleinerman | |
| 5,530,709 A | 6/1996 | Waarts et al. | |
| 5,696,782 A | 12/1997 | Harter et al. | 372/25 |

FOREIGN PATENT DOCUMENTS

| | | |
|---|---|---|
| DE | 19619983 | 12/1996 |
| DE | 100 21 041 A1 | 11/2001 |
| EP | 0915613 | 5/1999 |
| JP | 2001270070 | 10/2001 |

OTHER PUBLICATIONS

Computer-generated translation of JP 2001-270070 cited in the IDS on Dec. 6, 2004.*
Helmut Kipphahn, Handbook of Print Media, Berlin 2000, pp. 597-656.

* cited by examiner

*Primary Examiner*—Huan Tran
(74) *Attorney, Agent, or Firm*—Davidson Davidson & Kappel, LLC

(57) ABSTRACT

A method for imaging a printing form, in which a laser (140) generates a sequence of pulses (172, 220) of electromagnetic radiation corresponding to the image information of an image area (200, 202, 204, 206) to be generated on the printing form (118), and the image area (200, 202, 204, 206) to be generated on the printing form (118) is patterned according to the image information by interaction with the electromagnetic radiation, has the feature that the sequence of pulses (172, 220) of electromagnetic radiation is amplified by an amplifier (160); the amplifier (160) being discharged in a controlled manner by additional pulses (176, 222) corresponding to a non-image area (132, 208, 210, 212) of the printing form (118) in such a way that interference pulses of the amplifier (160) are prevented.

12 Claims, 3 Drawing Sheets

METHOD AND DEVICE FOR IMAGING OF A PRINTING FORM

This claims the benefit of German Patent Application No. 103 57 432.8, filed Dec. 9, 2003 and hereby incorporated by reference herein.

BACKGROUND INFORMATION

The present invention relates to a method for imaging a printing form. The present invention is also directed to a device for imaging a printing form.

When imaging printing plates capable of being imaged once or multiple times, printing sleeves, printing belts, or printing cylinder surfaces (in this patent application generally referred to as "printing form" hereinafter), the image data for the print job is processed by a raster image processor (RIP), and usually provided to a laser imaging device (mostly using an infrared laser), which transfers or writes the data as image information to the surface or into an upper layer of the printing form in the form of a pattern.

For this purpose, the prior art has disclosed offline imaging devices (such as plate setters) using the internal drum, external drum, or flatted principles, which transfer the image information to the printing form to be produced, i.e., to be imaged, using the computer-to-plate process (CAP), and are therefore suitable for making printing forms. Such devices are described extensively, for example, in the "Handbook of Print Media", Helmet Kipphan, Springer Verlag, Berlin, 2000 (hereinafter: Kipphan) on pages 597 through 626.

Also known from the prior art are inline imaging devices, which are used in direct imaging printing presses (DI presses), for example, in the Quickmaster 46-DI or the Speedmaster 52-DI of the Heidelberger Druckmaschinen company. In these devices, too, a laser imaging device is driven by a RIP and supplied with the data containing the image information in order to write the image information to the printing form, using the computer-to-press method. Devices of this kind are also extensively described in Kipphan, for example, on pages 627 through 656.

For laser imaging of printing forms, output powers of more than 1 watt per laser beam combined with highest beam quality may be required, depending on the type of plate, because the usually high imaging speed allows the beam to act on the imaging spots of the printing form only for a few microseconds, which is why energy for interaction with the printing form and for patterning the printing form at the respective location of the imaging spot can be deposited by the beam only during a rather short period of time.

For this reason, the lasers usually used for laser imaging are gas lasers, such as argon-ion lasers or helium-neon lasers, which, however, occupy a rather large space. Also used are solid-state lasers, such as Nd-YAG lasers, which require less space. Having an adequate power rating, all these lasers are capable of providing the energy required for imaging without amplification of the laser energy produced. The lasers are controlled and modulated in accordance with the image data.

Also known from the prior art are less expensive lasers requiring much less space, such as diode lasers which, in addition, have a longer average life, but are mostly limited to a power range below 1 watt. The use of such lasers to image printing forms would make it necessary to provide amplification.

Amplification of the power of diode lasers can be achieved, for example, using pumped fiber amplifiers.

For example, in the long-distance telecommunications environment, it is already known from German Patent Application DE 196 19 983 A1 to amplify the signal of a laser diode by means of an amplifier stage composed of erbium-doped standard single mode optical fibers and a pump light source in the form of a further laser diode. Such systems are referred to as MOPA (Master Oscillator Power Amplifier). The master oscillator—in this case the above-mentioned laser diode—has low laser power and highest beam quality.

However, it is a known characteristic of such fiber amplifier systems, which are cw-pumped (i.e., continuously supplied with energy), that they can emit a pulse caused by self-excitation; i.e., without external excitation by the diode laser signal to be amplified. Such a pulse will hereinafter be generally referred to as "interference pulse". Since the fiber is pumped and, thus, supplied with energy continuously, the population inversion of the atoms or molecules involved in the amplification process can reach a level high enough for individual, spontaneously emitted photons to trigger a photon avalanche, and thus, to at least partially discharge the amplifier, thereby generating a pulse (this effect is called "self-q-switching effect", and the pulse so generated will hereinafter be referred to as "self-q-switched pulse").

Therefore, such an amplifier system cannot be used so easily for imaging printing forms because here, depending on the image information, for example, in the case of extensive non-printing areas which extend, in particular, in the circumferential direction, no imaging spot is to be produced during certain periods of time, and therefore, the fiber amplifier is not discharged by a signal of the imaging laser. Given a sufficiently long period of time, a self-q-switching effect can occur, as mentioned above, so that the fiber emits a signal independently, i.e., by self-excitation, which may lead to unwanted imaging in the form of an imaging spot, or destroy the output facet of the fiber.

Finally, from Japanese Patent Document JP 2001-27 00 70, where, for the purpose of imaging, a printing form is clamped to a cylinder, it is known to provide the image data for producing the printing form with so-called "dummy data". This dummy data is inserted into the image data sequence at the locations that correspond to an angular position of the cylinder in which not the printing form but the cylinder gap for clamping the printing form comes to lie in the optical path of the imaging laser. Thus, the dummy data, which basically corresponds to empty image information, prevents the laser beam from entering the cylinder gap, and from being reflected there in an uncontrolled manner.

BRIEF SUMMARY OF THE INVENTION

It is an object of the present invention to provide an improved method and an improved device for imaging a printing form.

A further or alternative object of the present invention is to provide an improved method and an improved device for imaging a printing form which prevent imaging errors during use thereof.

It is yet another or alternative object of the present invention to provide an improved method and an improved device for imaging a printing form which use diode lasers of low output power.

A method according to the present invention for imaging a printing form, in which a laser generates a sequence of pulses of electromagnetic radiation corresponding to the image information of an image area to be generated on the printing form, and the image area to be generated on the printing form is patterned according to the image information by interaction with the electromagnetic radiation, has the feature that the sequence of pulses of electromagnetic radiation is amplified by an amplifier; the amplifier being discharged in a controlled manner by additional pulses corresponding to a non-image area of the printing form in such a way that interference pulses of the amplifier are prevented.

In this connection, the term "non-image area" will be understood to include not only the non-printing area of the printing form (all areas of the printing form that will not be found in the product to be printed, for example, edge or intermediate areas that are cut off), but also areas which are located outside the printing form but get into the optical path of the laser because of the relative movement between the printing form and the imaging laser. The area of the cylinder gap, which is used for clamping a printing plate and is periodically rotated into the optical path of the imaging laser beam, can be mentioned as an example here.

In this connection, the term "discharging of the amplifier" will be understood to mean the at least partial removal of energy from the amplifier.

In accordance with the present invention, the imaging pulse sequence is amplified; the amplifier being discharged as a precautionary measure by additional pulses in gaps of the imaging pulse sequence. The discharging of the amplifier effectively prevents self-excitation of interference pulses in the amplifier. In this connection, the gaps in the imaging pulse sequence correspond to non-image areas, such as the area of the cylinder gap.

In other words, in accordance with the present invention, the amplifier is discharged by laser pulses not used for imaging when the so generated and amplified laser pulse cannot reach the printing form, but hits, for example, the cylinder gap.

By using the method of the present invention, it is possible to prevent interference pulses, such as self-q-switched pulses. Before the amplifier, for example, a laser-pumped fiber amplifier, has accumulated enough energy to independently generate an interference pulse, the energy stored in the amplifier is removed as a precautionary measure and deposited in an area that is not used for the production of a printed product.

Preferably, the non-image area of the printing form may be assigned to a non-printing area of the printing form, in particular to an edge area or to an intermediate area of the printing form, or to an area outside the printing form, such as the cylinder gap.

Moreover, for imaging, the printing form may be curved into a surface in the shape of a cylindrical segment, and the non-image area of the printing form may be assigned to a complementary cylindrical-segment shaped surface. A possible complementary cylindrical-segment shaped surface is, for example, the area of the cylinder gap.

A method according to the present invention for imaging a printing form, in which the image information of an image area to be generated on the printing form is provided for activating an imaging device in the image area, has the feature that additional information is provided for activating the imaging device in a non-image area of the printing form.

In accordance with the present invention, the image information, which usually contains image data for the image areas and gaps for the non-image areas, may be supplemented with additional data, preferably in the gaps. Although the gaps represent non-image areas, these gaps are usable according to the present invention. Activation of the imaging device in the gaps, i.e., in non-image areas, can be advantageously used to activate the imaging device without affecting the product to be printed. In this manner, for example, an amplifier can be discharged without effect while imaging is in progress.

Preferably, the additional information may be integrated into the image information.

A device according to the present invention for imaging a printing form, including a laser which generates a sequence of pulses of electromagnetic radiation corresponding to the image information of an image area to be generated on the printing form; the image area to be generated on the printing form being patterned according to the image information by interaction with the electromagnetic radiation, features an amplifier which amplifies the sequence of pulses of electromagnetic radiation, and a unit which generates additional pulses corresponding to a non-image area of the printing form; the additional pulses discharging the amplifier in a controlled manner such that interference pulses of the amplifier are prevented.

The use of the device according to the present invention provides advantages as have been described above with respect to the methods according to the present invention.

The unit which generates additional pulses corresponding to a non-image area of the printing form can advantageously be designed as a control system, and can form a unit, for example, with a control system of the laser.

According to a preferred embodiment of the present invention, the laser can be designed as a diode laser and the amplifier can take the form of a fiber amplifier; the interference pulses of the amplifier representing self-q-switched pulses.

To generate the additional pulses, a separate diode laser may also be provided which, for example, is synchronized to the cylinder rotation, and discharges the fiber amplifier as the cylinder gap is being traversed.

A printing-material processing machine, in particular a sheet-fed offset printing press or a platesetter according to the present invention, can feature a device according to the present invention.

BRIEF DESCRIPTION OF THE DRAWINGS

In the following, the present invention as well as further advantages of the present invention will be described in more detail by way of a preferred exemplary embodiment with reference to the drawings, in which.

In the drawings, like or corresponding features are given like reference numerals.

DETAILED DESCRIPTION

Figure 1:
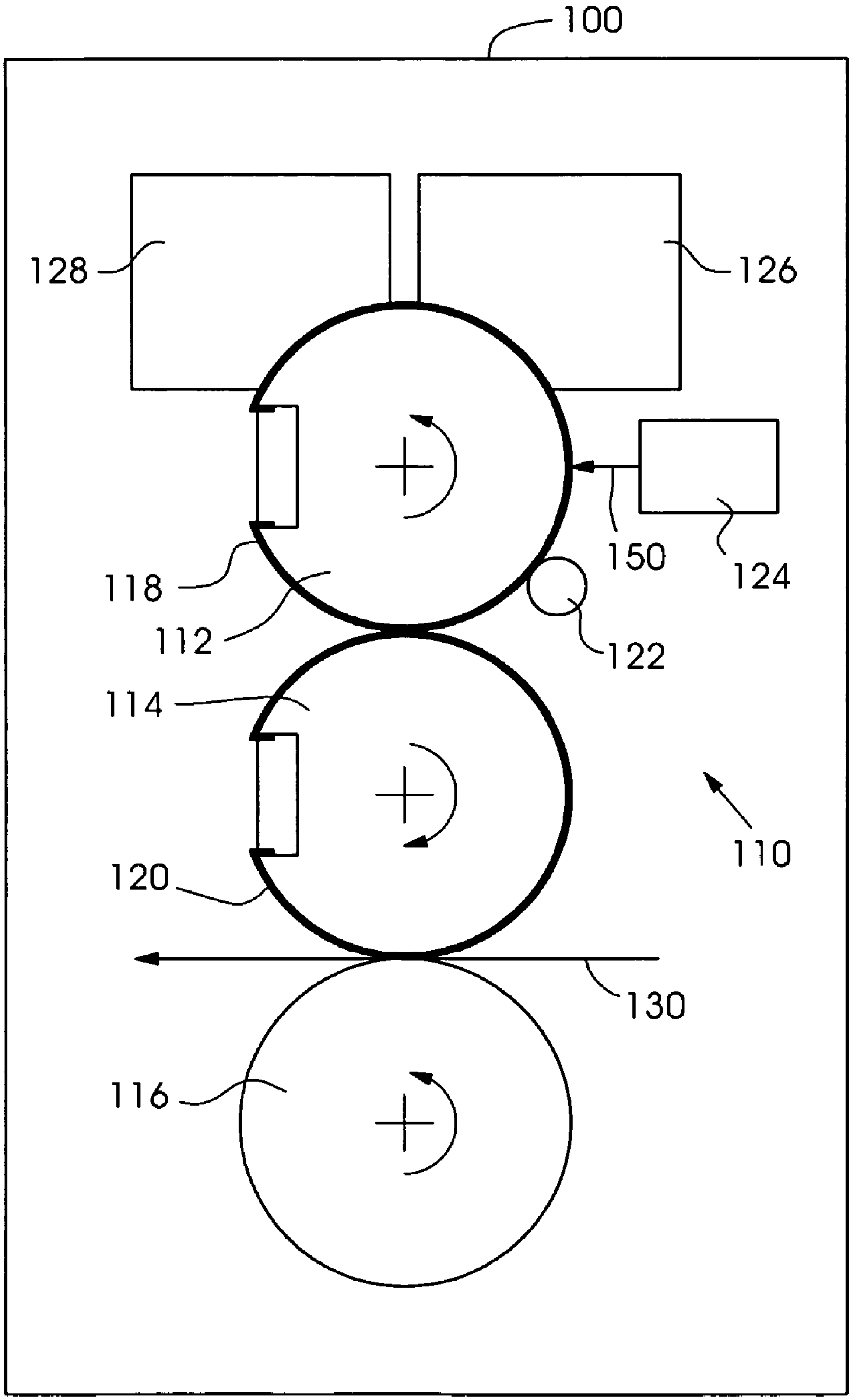
FIG. 1 shows a schematic side view of a printing unit having a device according to the present invention for imaging a printing form.

FIG. 1 shows a printing-material processing machine 100, here, in particular, a sheet-fed offset printing press. A printing unit 110 of the printing press is associated with a plate cylinder 112, a transfer cylinder 114, and an impression cylinder 116; a printing form in the form of an offset printing plate 118 being mounted on the surface of plate cylinder 112, and a rubber blanket 120 being mounted on the surface of transfer cylinder 114. Offset printing plate 118 is designed as an imagable or, possibly, reimagable printing plate.

A cleaning device 122, an inventive imaging device 124, a dampening system 126, and an inking system 128 are arranged along the circumference of plate cylinder 112. In an imaging mode, imaging device 124 generates a laser beam 150, which patterns the surface of printing plate 118 according to the image information. Imaging device 124 can be moved, for example, in an axial direction relative to the axis of the plate cylinder in order to completely image printing plate 118 during rotation thereof.

The cleaned and imaged (or, possibly, reimaged) printing plate 118 is provided with dampening solution and ink. The image produced on printing plate 118 is transferred to transfer cylinder 114, and from there to a paper sheet 130.

Figure 2A:
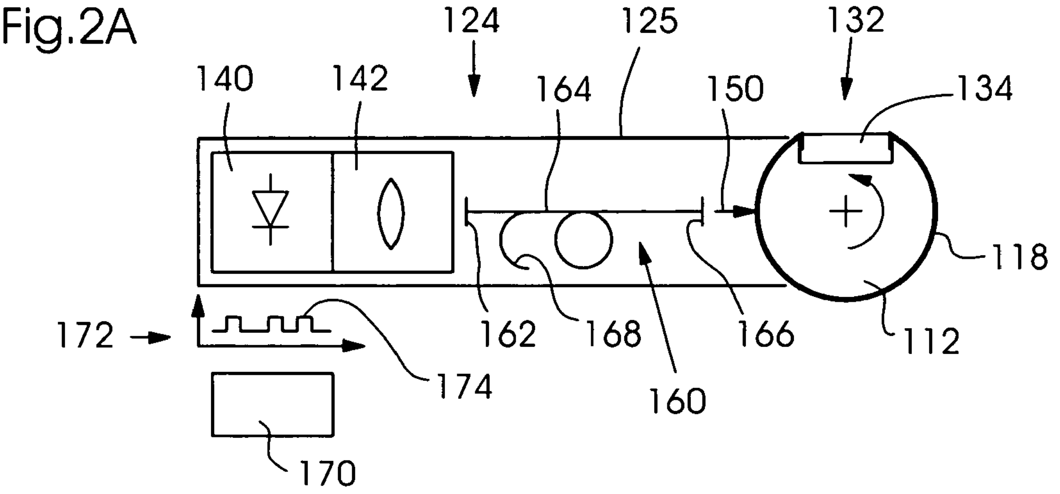
FIG. 2A-C is a schematic representation of a device according to the present invention for imaging a mounted printing form in a sequence of imaging steps.
Figure 2B:
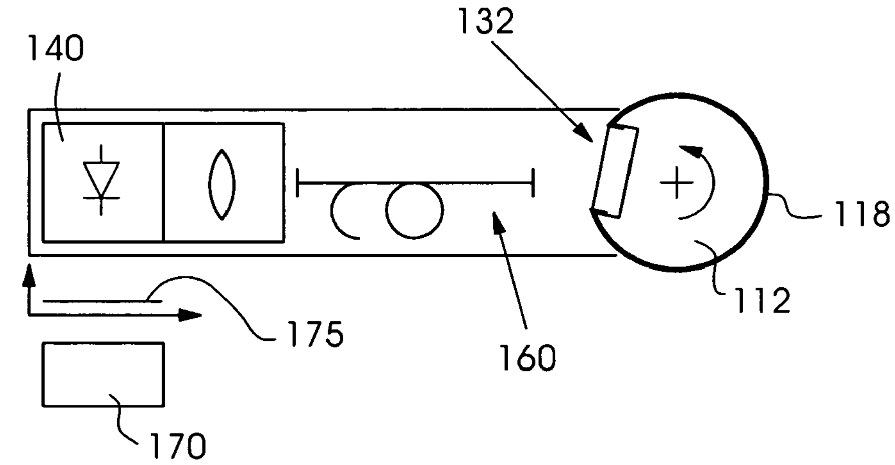
Figure 2C:
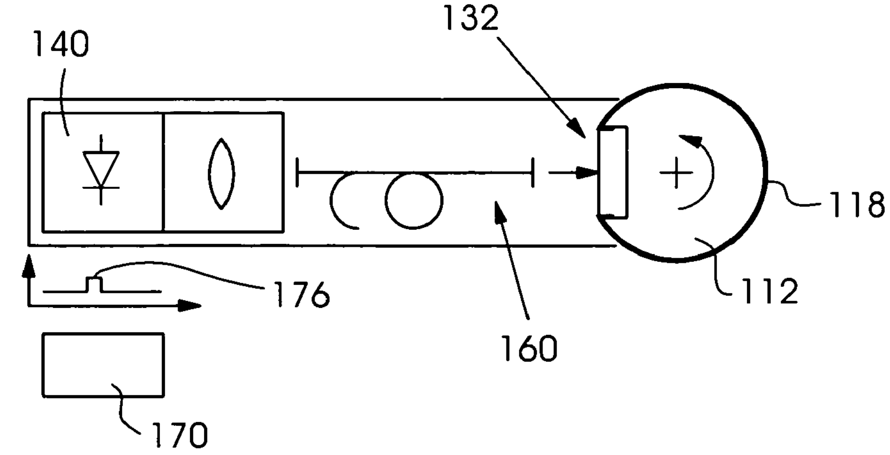

FIGS. 2A through 2C show one device 124 (imaging device) according to the present invention for imaging a printing form 118. In this exemplary embodiment, the printing form is mounted as a printing plate 118 on the surface of rotating plate cylinder 112, and held at its edges by a plate clamping device 134 accommodated in a cylinder gap 132. Plate cylinder 112 is not shown true to scale, but scaled down relative to device 124, and is in a different angular position in each of the three figures.

Device 124 first of all includes a diode laser 140, an optical system 142, and a fiber amplifier 160. A laser beam generated by diode laser 140 is passed through optical system 142 for beam shaping and focusing and directed onto a first fiber end 162 (input facet) of fiber amplifier 160. The laser beam goes through fiber 164 of fiber amplifier 160 and emerges at second fiber end 166 (output facet) of the fiber amplifier. Both fiber ends 162, 166 of fiber amplifier 160 are preferably provided with an antireflection coating. The fiber amplifier 160 is continuously supplied with energy, i.e., cw-pumped, via a pump laser and a fiber 168. As the laser beam passes through amplifier 160, it is amplified to a degree necessary for imaging printing plate 118; that is, the power of diode laser 140 is amplified from below 1 watt (e.g., the milliwatt range) to over 1 watt. Finally, laser beam 150 strikes the surface or a subsurface layer of printing plate 118, producing or writing an imaging spot at the point of incidence by interaction with the material of printing plate 118.

Imaging device 124 further includes a shielding 125, which prevents laser radiation from exiting to the outside.

As shown in FIG. 2A, diode laser 140 is driven by a control system 170 via a data connection; control system 170 in turn being supplied with the processed image data, i.e., with a sequence of image data, by a RIP. Control system 170 drives diode laser 140 in such a manner that it generates a sequence 172 of laser pulses 174, which correspond to the image data. As a consequence, a corresponding sequence of imaging spots is produced on the surface of rotating printing plate 118 by the action of pulsed or modulated laser beam 150. The processed image information also contains gaps in the sequence which correspond to the area of cylinder gap 132, which is not to be imaged, and to the areas of the plate edges, which are not to be imaged either (see FIG. 3).

FIG. 2B reveals that control system 170 does not activate diode laser 140 (see line 175) when cylinder gap 132 comes to lie in the optical path of the laser beam. For each revolution of plate cylinder 112, therefore, a gap is provided in the image data sequence; the gap essentially corresponding to the length of cylinder gap 132 and the non-printing plate edges.

However, since fiber amplifier 160 continues to be cw-pumped, control system 170 drives diode laser 140 in such a manner that one or more additional pulses 176 are generated to discharge amplifier 160 as a precautionary measure, as shown in FIG. 2C, to prevent an unwanted self-q-switched pulse in advance. However, this pulse 176 is not directly associated with image data, i.e., with an image area of printing plate 118, but with a non-image area of printing plate 118 (in this case with the area of cylinder gap 132). Thus, the laser pulse so generated is not directed onto printing plate 118, but into the non-printing area of cylinder gap 132, where the beam is preferably absorbed or (diffusely) reflected in such a manner it is strongly scattered. As a supporting measure, provision can also be made to provide a section in cylinder gap 132 with increased roughness for diffuse scattering, or with increased absorptivity, and to direct the laser pulse into this section in a controlled manner to discharge the amplifier.

Since the focus of the laser beam in the region of the plate surface is only about 10 micrometers in diameter, and the beam is strongly divergent outside the focal plane, no specular reflexion is to be expected in cylinder gap 132.

Figure 3:
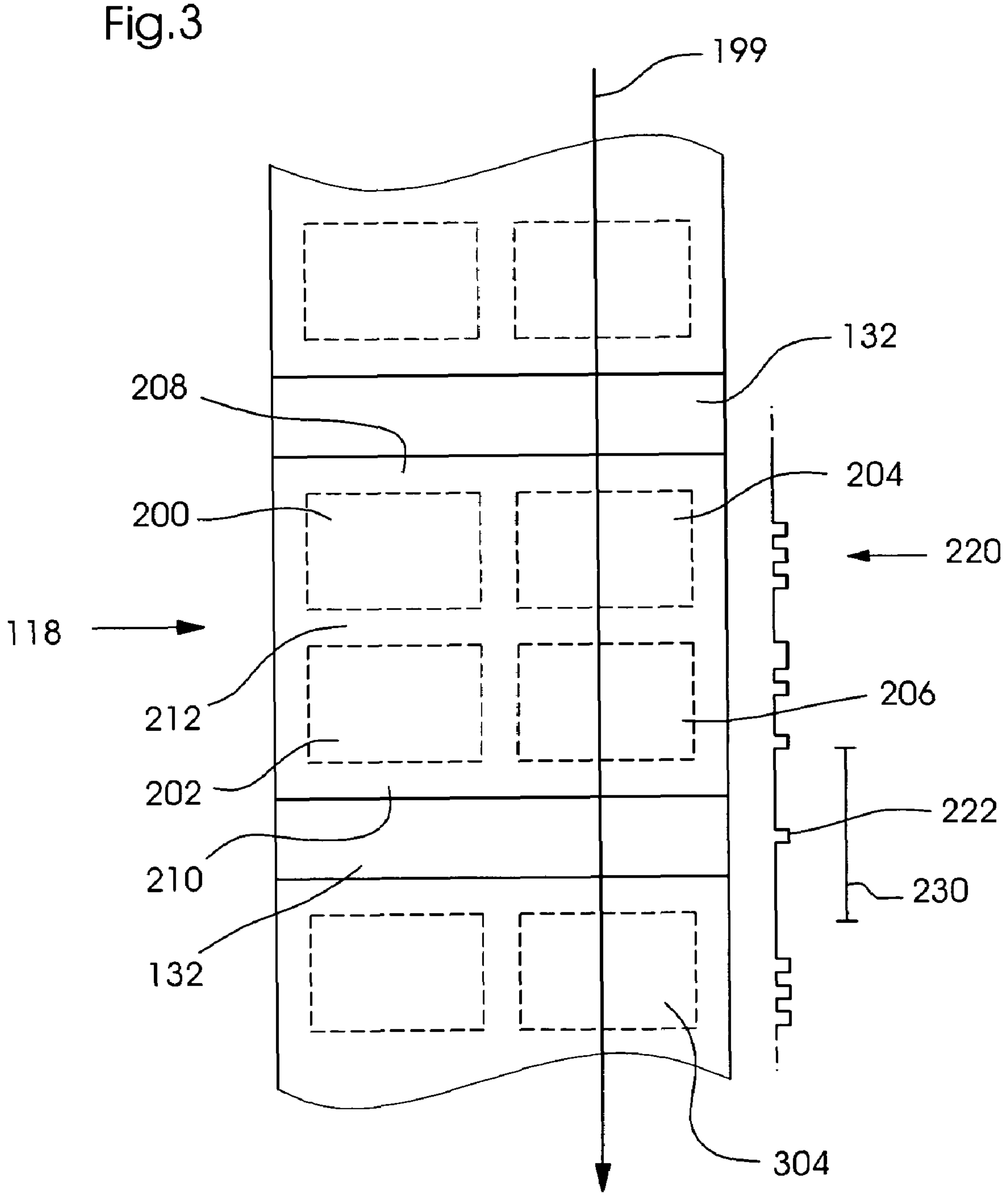
FIG. 3 is a schematic view of the method according to the present invention for imaging a printing form.

FIG. 3 schematically shows the path 199 of the point of incidence of laser beam 150 on a printing plate 118 mounted on a rotating cylinder having a cylinder gap. To illustrate the relationships relevant here, the cylindrical surface of plate cylinder 112 with printing plate 118 and cylinder gap 132 is shown developed into a plane several times.

Shown is a printing plate 118 having print images 200, 202, 204 and 206 (image areas), non-printing edge areas 208 and 210, and a non-printing intermediate area 212. Adjacent to printing plate 118 is the area of cylinder gap 132. With each rotation of cylinder 112, the sequence of printing plate 118 and cylinder gap 132 is repeated.

Next to the developed printing plate, a pulse sequence 220 of laser beam 150 is depicted by way of example to show the points at which laser 140 is switched on and off, respectively.

Laser beam 150 (see FIG. 2A) successively sweeps over non-printing upper edge area 208, upper print image 204, non-printing intermediate area 212, lower print image 206, non-printing lower edge area 210, and the area of cylinder gap 132. In accordance with the image information, imaging spots are written only in upper and lower print images 204 and 206. Accordingly, no imaging spots are written in edge and intermediate areas 208, 210 and 212.

To discharge fiber amplifier 160 as a precautionary measure, a pulse 222 (possibly also a plurality of pulses) of diode laser 140 is generated also in the area of cylinder gap 132.

Next to pulse sequence 220, time period 230 (i.e., the corresponding segment in path 199), which would pass before the undischarged fiber amplifier 160 would independently generate a self-q-switched pulse, is depicted by way of example. It can be seen that without discharging amplifier 160 as a precautionary measure after the last pulse associated with lower print image 206, an interfering self-q-switched pulse would be generated, resulting in an unwanted imaging spot on printing plate 118 in the subsequent upper print image 304. However, such an unwanted imaging spot can be advantageously prevented by discharging the amplifier in the area of cylinder gap 132.

Given an imaging speed of, for example, 12000 plate cylinder revolutions per hour and a cylinder diameter of 220 millimeters, a surface speed of about 2300 millimeters per second is produced. Thus, assuming an image area of 512 millimeters in circumference, the image area is swept over in a time period of about 222 milliseconds. No self-excited self-q-switched pulse should occur during this time period.

In reference to FIG. 3, it should be noted that when using an external drum imagesetter for imaging, the method of the present invention can be used accordingly; i.e., additional pulses for discharging the amplifier can be generated, for example, in the area of a plate clamping device. When using internal drum imagesetters, it is possible to proceed in the same fashion. In this case too, the laser beam sweeps over areas that are not part of the image area, such as non-printing areas or areas next to the printing plate. In the case of flatted imaging, the discharge pulses can be placed in edge or intermediate areas accordingly. Alternatively, the laser can also generate a discharge pulse in an area next to the printing plate.

The lateral edge areas of the printing plate or the areas located laterally next to the printing plate can also be used for discharging the amplifier, for example, when the laser beam is periodically swept over these areas by mirror deflection or feed motion.

In a further embodiment of the present invention, it is alternatively proposed to discharge the fiber amplifier 160 using a second laser, for example, a further diode laser, which emits a different wavelength than the imaging diode laser. If the printing plate essentially absorbs only the wavelength of the first, i.e. the imaging diode laser (narrow-band printing plate), then the second, i.e., the discharge laser can also operate in the image area of the printing plate because the radiation of the second laser cannot produce an imaging spot.

REFERENCE SYMBOL LIST

100 printing-material processing machine
110 printing unit
112 plate cylinder
114 transfer cylinder
116 impression cylinder
118 printing plate
120 rubber blanket
122 cleaning device
124 imaging device
125 shielding
126 dampening system
128 inking system
130 paper sheet
132 cylinder gap
134 plate clamping device
140 diode laser
142 optical system
150 laser beam
160 fiber amplifier
162 first fiber end
164 fiber
166 second fiber end
168 fiber
170 control system
172 sequence
174 laser pulses
175 line
176 additional laser pulses
199 path
200 print image
202 print image
204 print image
206 print image
208 edge area
210 edge area
212 intermediate area
220 pulse sequence
222 pulse
230 time period
304 print image

What is claimed is:

1. A method for imaging a printing form comprising:

using a laser to generate a sequence of pulses of electromagnetic radiation corresponding to image information of an image area to be generated on a printing form, the image area to be generated on the printing form being patterned according to the image information by interaction with the electromagnetic radiation; and amplifying the sequence of pulses of electromagnetic radiation by an amplifier; and discharging the amplifier in a controlled manner by additional pulses corresponding to a non-image area of the printing form in such a way that interference pulses of the amplifier are prevented.

2. The method as recited in claim 1 wherein the non-image area of the printing form is assigned to a non-printing area of the printing form or to an area outside the printing form.

3. The method as recited in claim 2 wherein the non-printing area is an edge area or an intermediate area of the printing form.

4. The method as recited in claim 1 wherein for imaging, the printing form is curved into a surface in a shape of a cylindrical segment, and the non-image area of the printing form is assigned to a complementary cylindrical-segment shaped surface.

5. The method as recited in claim 1 wherein the non-image area of the printing form is assigned to a cylinder gap of a printing plate cylinder.

6. A method for imaging a printing form comprising:

providing image information of an image area to be generated on the printing form for activating an imaging device in the image area; and providing additional information for activating the imaging device in a non-image area of the printing form.

7. The method as recited in claim 6 wherein the additional information is integrated into the image information.

8. A device for imaging a printing form comprising:

a laser generating a sequence of pulses of electromagnetic radiation corresponding to the image information of an image area to be generated on the printing form, the image area to be generated on the printing form being patterned according to the image information by interaction with the electromagnetic radiation;

an amplifier amplifying the sequence of pulses of electromagnetic radiation;

the laser generating additional pulses corresponding to a non-image area of the printing form, the additional pulses discharging the amplifier in a controlled manner such that interference pulses of the amplifier are prevented.

9. The device as recited in claim 8 wherein the laser is a diode laser and the amplifier is a fiber amplifier, the interference pulses of the amplifier representing self-q-switched pulses.

10. A printing-material processing machine comprising the device as recited in claim 8.

11. The printed material processing machine as recited in claim 10 wherein the machine is a sheet-fed offset printing press.

12. A platesetter comprising the device as recited in claim 8.

* * * * *

UNITED STATES PATENT AND TRADEMARK OFFICE

CERTIFICATE OF CORRECTION

PATENT NO. : 7,259,774 B2
APPLICATION NO. : 11/006301
DATED : August 21, 2007
INVENTOR(S) : Bernard Beier It is certified that error appears in the above-identified patent and that said Letters Patent is hereby corrected as shown below:

Column 1, line 24, “flatted” should be changed to --flatbed--.

Column 1, line 26, “(CAP)” should be changed to --(CtP)--.

Column 1, line 29, “Helmet” should be changed to --Helmut--.

Column 7, line 5, “flatted” should be changed to --flatbed--.

Signed and Sealed this

Eleventh Day of March, 2008

JON W. DUDAS

*Director of the United States Patent and Trademark Office*